(12) United States Patent
Nakata et al.

(10) Patent No.: US 6,592,973 B1
(45) Date of Patent: Jul. 15, 2003

(54) CARD AND PROCESS FOR PRODUCING THE CARD

(75) Inventors: Yasukazu Nakata, Chiyoda (JP); Akira Ichikawa, Saitama (JP); Katsuhisa Taguchi, Saitama (JP); Yuichi Iwakata, Saitama (JP)

(73) Assignee: Lintec Corporation, Tokyo (JP)

( * ) Notice: Subject to any disclaimer, the term of this patent is extended or adjusted under 35 U.S.C. 154(b) by 117 days.

(21) Appl. No.: 09/641,951

(22) Filed: Aug. 21, 2000

(30) Foreign Application Priority Data

Sep. 2, 1999 (JP) .............................. 11-249274

(51) Int. Cl.⁷ .................. B32B 27/36; C09D 133/04; C09D 175/06
(52) U.S. Cl. .................. 428/209; 428/901; 427/508; 427/521; 156/275.5; 156/275.7; 156/331.4; 156/331.7; 156/330; 156/327; 156/332
(58) Field of Search .................. 156/275.3, 275.5, 156/275.7, 331.4, 331.7, 332; 430/271.1, 284.1, 428.209; 428/209, 901; 427/508, 521

(56) References Cited

U.S. PATENT DOCUMENTS

| | | | | |
|---|---|---|---|---|
| 4,424,252 A | * | 1/1984 | Nativi | 427/510 |
| 5,728,505 A | * | 3/1998 | Dueber et al. | 430/271.1 |
| 5,866,656 A | * | 2/1999 | Hung et al. | 524/507 |

FOREIGN PATENT DOCUMENTS

| | | |
|---|---|---|
| EP | 0768353 | 4/1997 |
| EP | 0835917 | 4/1998 |
| EP | 0935288 A2 | 8/1999 |

* cited by examiner

Primary Examiner—Sam Chuan Yao
(74) Attorney, Agent, or Firm—Young & Thompson

(57) ABSTRACT

A card sealed by using a composition which includes an acrylate compound polymerizable by an ionizing radiation and 1 to 40 parts by weight of a polyfunctional isocyanate compound per 100 parts by weight of the acrylate compound and can be cured by irradiation of the ionizing radiation and a process for producing a card disposing a coating layer of the composition between a substrate sheet and a cover sheet and curing the coating layer by irradiation of an ionizing radiation.

5 Claims, 2 Drawing Sheets

CARD AND PROCESS FOR PRODUCING THE CARD

BACKGROUND OF THE INVENTION

1. Field of the Invention

The present invention relates to a card and a process for producing the card. More particularly, the present invention relates to a card which is sealed by using a composition of the ionizing radiation curing type, shows excellent adhesion between a substrate sheet on which an IC chip and other members are disposed and a cover sheet and has faces with little unevenness and suitable flexibility and a process for producing a card such as IC cards having the above characteristics and excellent reliability with excellent productivity.

2. Description of Related Art

IC cards are generally produced by integrally laminating a cover sheet to a substrate sheet on which an IC chip and members related to the IC chip such as an antenna, chip condensers, batteries and electronic circuits are disposed, followed by forming prints for showing various informations, magnetic stripes and embosses on the face of the cover sheet. As the process for laminating the substrate sheet and the cover sheet, in general, a process of heat sealing and a process using an adhesive are used.

However, the process of heat sealing has drawbacks in that the process cannot be used when the electronic members disposed on the substrate sheet do not allow the temperature and the pressure of working necessary for the process and that specific types of the substrate sheet and the cover sheet must be used. When an adhesive is used for the heat sealing, the adhesive is restricted similarly depending on the type of electronic members disposed on the substrate sheet and some of conventional adhesives of the hot melt type cannot be used. Cards obtained by lamination using an adhesive of the hot melt type have a drawback in that the adhesive strength is small and the substrate sheet and the cover sheet tend to be separated. Therefore, special expensive adhesives must be used as the sealing material for cards in the process of heat sealing.

A card which shows excellent adhesion between a substrate sheet and a cover sheet and has faces with little unevenness caused by the IC chip and members related to the IC which are disposed inside, suitable flexibility and excellent reliability is required as the IC card.

SUMMARY OF THE INVENTION

An object of the present invention is to provide a card sealed by using a sealing composition which gives excellent adhesion between a substrate sheet on which an electronic chip and members related to the chip are disposed and a cover sheet and has faces with little unevenness, suitable flexibility and excellent reliability and a process for producing a card having the above characteristics with excellent productivity.

As the result of intensive studies by the present inventors to achieve the above object, it was found that a sealing composition which comprises specific components and can be cured by irradiation of an ionizing radiation is suitable for achieving the object and that, when the sealing composition is disposed between a substrate sheet and a cover sheet and cured by irradiation of an ionizing radiation, a card which shows excellent adhesion between the substrate sheet and the cover sheet and has faces with little unevenness, suitable flexibility and excellent reliability can be obtained with excellent productivity. The present invention has been completed based on this knowledge.

The present invention provides:

(1) A card sealed by using a composition which comprises (A) an acrylate compound polymerizable by an ionizing radiation and (B) 1 to 40 parts by weight of a polyfunctional isocyanate compound per 100 parts by weight of said acrylate compound and can be cured by irradiation of the ionizing radiation; and (2) A process for producing a card which comprises disposing a coating layer of a composition for sealing a card described in (1) on a face of a substrate sheet on which an electronic chip and members related to the electronic chip are disposed, the electronic chip and the members being disposed at least on one of the faces of the substrate sheet, tightly placing a cover sheet on the coating layer and curing the composition by irradiating an ionizing radiation to the coating layer.

Figure 1:
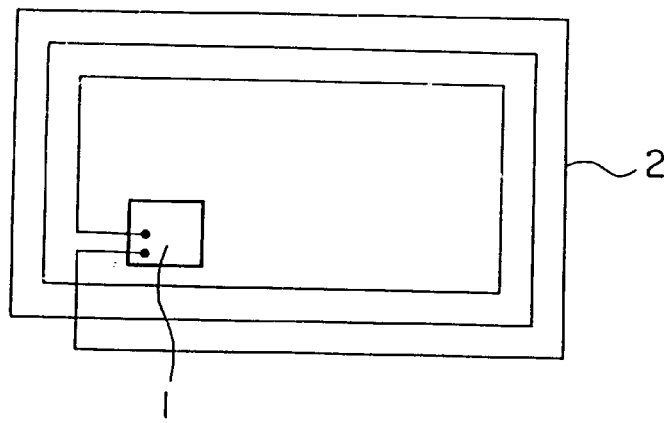
FIG. 1 shows a plan view of a typical circuit of an IC card of the non-contact type.

In the figures, the numbers represent members and portions as follows:

| | |
|---|---|
| 1 and 1': | IC chips |
| 2 and 2': | Antennas |
| 3 and 3': | Substrate sheets |
| 4, 4a and 4b: | Cover sheets |
| 5: | A coating layer (a sealing composition) |

DESCRIPTION OF THE PREFERRED EMBODIMENTS

The composition used for sealing the card of the present invention will be described in the following.

The composition used for sealing the card of the present invention comprises (A) an acrylate compound polymerizable by an ionizing radiation and (B) a polyfunctional isocyanate compound as the essential components. Examples of the acrylate compound polymerizable by an ionizing radiation of component (A) include polymerizable prepolymers of acrylates and polymerizable monomers.

Examples of the polymerizable prepolymers of acrylates include prepolymers of polyester acrylates, epoxyacrylates, urethane acrylates and polyol acrylates. The prepolymers of polyester acrylates can be obtained, for example, by esterification of hydroxyl groups in polyester oligomers having hydroxyl groups at both ends which are obtained by condensation of polybasic carboxylic acids and polyhydric alcohols with (meth)acrylic acid or esterification of hydroxyl groups at the ends of oligomers which are obtained by addition of alkylene oxides to polybasic carboxylic acids with (meth)acrylic acid. The prepolymers of epoxyacrylates can be obtained, for example, by the reaction of oxirane rings in epoxy resins of the bisphenol type or epoxy resins of the novolak type having relatively low molecular weight with (meth)acrylic anhydride. The prepolymers of urethane acrylates can be obtained, for example, by esterification of polyurethane oligomers which are obtained by the reaction of polyetherpolyols or polyesterpolyols and polyisocyanates with (meth)acrylic acid. The prepolymers of polyol acrylates can be obtained, for example, by esterification of hydroxyl groups in polyetherpolyols with (meth)acrylic acid. The polymerizable prepolymers of acrylates may be used singly or in combination of two or more.

The weight-average molecular weight of the above polymerizable prepolymers of acrylates is selected preferably in the range of 500 to 100,000, more preferably in the range of 1,000 to 70,000 and most preferably in the range of 3,000 to 40,000. The weight-average molecular weight is obtained in accordance with the gel permeation chromatography (GPC) as the corresponding value of polymethyl methacrylate.

Examples of the polymerizable monomers include monomers which can be used as reactive diluents for decreasing viscosity of the polymerizable prepolymers of acrylates and monomers which can decrease the surface tension such as monomers having a surface tension of 40 dyne/cm or smaller.

The above reactive diluent has the function of providing a cured product with elasticity or rigidity in addition to the function as the reactive diluent. As the reactive diluent, any of monofunctional polymerizable monomers and polyfunctional polymerizable monomers can be used. Examples of the polymerizable monofunctional monomers include cyclohexyl (meth)acrylate, 2-ethylhexyl (meth)acrylate, lauryl methacrylate and stearyl (meth)acrylate. Examples of the polyfunctional polymerizable monomer include 1,4-butanediol di(meth)acrylate, 1,6-hexanediol di(meth) acrylate, neopentyl glycol diacrylate, polyethylene glycol di(meth)acrylate, neopentyl glycol adipate di(meth)acrylate, neopentyl glycol hydroxypivalate di(meth)acrylate, dicyclopentanyl di(meth)acrylate, dicyclopentenyl di(meth)acrylate modified with caprolactone, phosphoric acid di(meth) acrylate modified with ethylene oxide, cyclohexyl di(meth) acrylate modified with allyl group, di(meth)acrylate modified with ethylene oxide isocyanurate, trimethylolpropane triacrylate, dipentaerythritol tri(meth)acrylate, dipentaerythritol tri(meth)acrylate modified with propionic acid, pentaerythritol trimethacrylate, trimethylolpropane tri(meth) acrylate modified with propylene oxide, tris(acryloxyethyl) isocyanurate, dipentaerythritol penta(meth)acrylate modified with propionic acid, dipentaerythritol hexa(meth) acrylate and dipentaerythritol hexa(meth)acrylate modified with caprolactone.

The monomer which decreases the surface tension is a monomer having a surface tension of 40 dyne/cm or smaller and effective for improving the property for coating on substrate sheets, in particular, the wetting property. Examples of such monomers include isooctyl acrylate (28 dyne/cm), lauryl acrylate (30 dyne/cm), isobornyl acrylate (32 dyne/cm), isobornyl methacrylate (31 dyne/cm), tetrahydrofurfuryl acrylate (35 dyne/cm), neopentyl glycol dimethacrylate (32 dyne/cm), ethylene glycol dimethacrylate (33 dyne/cm), trimethylolpropane trimethacrylate (34 dyne/cm) and pentaerythritol triacrylate (39 dyne/cm).

It is preferable that the card of the present invention has suitable flexibility. Therefore, it is preferable that one or more compounds are suitably selected from the acrylate compounds polymerizable by an ionizing radiation in accordance with the types of the substrate sheet and the cover sheet so that physical properties of the cured product are controlled.

It is preferable that the acrylate compound polymerizable by an ionizing radiation comprises the polymerizable prepolymer of an acrylate, the reactive diluent and the monomer decreasing the surface tension in such amounts that the ratio by weight is in the range of 100:0 to 50:0 to 50.

Examples of the polyfunctional isocyanate compound of component (B) include aromatic polyisocyanate compounds such as tolylene diisocyanate, diphenylmethane diisocyanate and xylylene diisocyanate; aliphatic polyisocyanate compounds such as hexamethylene diisocyanate and tetramethylene diisocyanate; alicyclic polyisocyanates such as isophorone diisocyanate, hydrogenated diphenylmethane diisocyanate and hydrogenated xylylene diisocyanate; biuret compounds, dimers and trimers of these polyisocyanates; and addition products and reaction products obtained from these polyisocyanates in excess amounts and polyols having a low molecular weight such as ethylene glycol, glycerol, trimethylolpropane and pentaerythritol.

The polyfunctional isocyanate compound of component (B) works as the agent for improving adhesion. The polyfunctional isocyanate compound may be used singly or in combination of two or more. From the standpoint of the effect of improving adhesion and other physical properties of the cured product, it is preferable that the amount is selected in the range of 10 to 40 parts by weight, more preferably in the range of 3 to 30 parts by weight and most preferably in the range of 5 to 20 parts by weight per 100 parts by weight of the acrylate compound polymerizable by an ionizing radiation of component (A). In accordance with the above formulation, the sealing composition used in the present invention exhibits an improved chemical affinity with the surface of the sheets used as the substrate sheet and the cover sheet and a sufficient adhesion can be achieved.

When the card of the present invention is sealed by using the sealing composition, the sealing composition can be made curable by light such as ultraviolet light, where desired, by adding a photopolymerization initiator into the sealing composition. Examples of the photopolymerization initiator include benzoin, benzoin methyl ether, benzoin ethyl ether, benzoin isopropyl ether, benzoin n-butyl ether, benzoin isobutyl ether, acetophenone, dimethylaminoacetophenone, 2,2-dimethoxy-2-phenylacetophenone, 2,2-diethoxy-2-phenylacetophenone, 2-hydroxy-2-methyl-1-phenylpropane-1-one, 1-hydroxycyclohexyl phenyl ketone, 2-methyl-1-[4-(methylthio)phenyl]-2-morpholinopropane-1-one, 4-(2-hydroxyethoxy)phenyl-2-(hydroxy-2-propyl) ketone, benzophenone, p-phenylbenzophenone, 4,4'-diethylaminobenzophenone, dichlorobenzophenone, 2-methylanthraquinone, 2-ethylanthraquinone, 2-tert-butylanthraquinone, 2-aminoanthraquinone, 2-methylthioxanthone, 2-ethylthioxanthone, 2-chlorothioxanthone, 2,4-dimethylthioxanthone, 2,4-diethylthioxanthone, benzyl dimethyl ketal, acetophenone dimethyl ketal and esters of p-dimethylaminobenzoic acid. The photopolymerization initiator may be used singly or in combination of two or more. In general, the amount is selected in the range of 0.2 to 10 parts by weight per 100 parts by weight of the acrylate compound polymerizable by an ionizing radiation of component (A).

The sealing composition used in the present invention may further comprise, where desired, suitable fillers to prevent adverse effects of oxygen, improve heat resistance and suppress heat shrinkage and suitable plasticizers to adjust flexibility of cured products as long as the object of the present invention is not adversely affected. It is preferable that the filler comprised in the sealing composition is transparent.

It is preferable that the composition for sealing the card of the present invention has a viscosity in the range of 100 to 5,000 cps at 25° C. before being cured. When the viscosity is smaller than 100 cps, forming a thick coating layer is difficult. When the viscosity exceeds 5,000 cps, there is the possibility that the sealing composition is not sufficiently applied into gaps between electronic circuits and that adhesion is poor due to formation of rough surfaces on the coating layer. It is preferable that the surface tension of the sealing composition is in the range of 30 to 40 dyne/cm. When the surface tension is smaller than 30 dyne/cm, there is the possibility that adhesive strength decreases. When the surface tension exceeds 40 dyne/cm, there is the possibility that workability deteriorates in coating the substrate sheet. The sealing composition is cured by application of an ionizing radiation. It is preferable that the ionizing radiation is ultraviolet light from the standpoint of the practical use. The ultraviolet light can be obtained by using a high pressure mercury lamp, a fusion H lamp or a xenone lamp.

It is required that the composition for sealing the card exhibits sufficient adhesion between a substrate sheet and a cover sheet and provides cured products with a suitable modulus. The modulus can be expressed as the tensile modulus and evaluated by the tensile test of plastics in accordance with the method of Japanese Industrial Standard K7113. It is preferable that the tensile modulus of the cured product obtained from the sealing composition is in the range of 0.01 to 2.0 kg/mm$^2$ and more preferably in the range of 0.4 to 1.2 kg/mm$^2$.

When the tensile modulus is smaller than 0.01 kg/mm$^2$, the card obtained after the sealing has insufficient elasticity and shows insufficient recovery of the shape after being deformed in the tests of twisting and bending. Therefore, there is the possibility that the product cannot be used as a card. When the tensile modulus exceeds 2.0 kg/mm$^2$, the card obtained after the sealing cannot deform sufficiently in response with twisting and bending stresses and this causes separation between the substrate sheet and the sealing composition or between the cover sheet and the sealing composition.

The composition for sealing the card of the present invention is applied in a sufficient thickness such that electronic members such as an IC Chip disposed on the substrate sheet are completely contained inside the coating layer. The thickness of the sealing composition including the electronic members contained therein is generally about 20 to 1,000 μm and preferably about 100 to 500 μm.

As described above, the composition for sealing the card is applied in a greater thickness in comparison with other coating materials. Therefore, unless the sealing composition has sufficient flexibility, fracture of the materials and separation between the layers tend to take place and these phenomena causes destruction of electronic circuits. This leads to deterioration in reliability as IC cards.

By placing the composition for sealing the card of the present invention between the substrate sheet on which an IC chip and other members are disposed and a cover sheet, followed by curing the sealing composition by irradiation of an ionizing radiation, the card exhibiting excellent adhesion between the above sheets and having faces with little unevenness, a suitable flexibility and excellent reliability can be obtained with excellent productivity.

The process for producing a card of the present invention will be described in the following.

In the process of the present invention, a substrate sheet having an electronic chip and members related to the electronic chip disposed at least on one face thereof is used. Examples of the members related to the electronic chip include antennas, chip condensers, IC chips and batteries.

FIG. 1 shows a plan view of a typical circuit of an IC card of the non-contact type. The circuit has a structure in which an IC chip 1 and an antenna coil 2 disposed around the chip are connected to each other.

The sheet used for the substrate sheet having an electronic chip and members related to the electronic chip disposed at least on one face thereof is not particularly limited as long as the sheet has the electric insulating property and can be suitably selected from substrate sheets conventionally used for cards. Examples of the substrate sheets include insulating sheets made of paper, wood materials and synthetic resins such as polyethylene, polyesters, polypropylene, polyvinyl chloride, acrylic resins, polycarbonates, polyimides, epoxy resins, urea resins, urethane resins and melamine resins. Among these sheets, flexible sheets made of polyesters are preferable and flexible sheets made of polyethylene terephthalate are more preferable. The thickness of the sheet is generally about 10 to 500 μm and preferably 25 to 250 μm.

On the substrate sheet, conductive circuits for electrically connecting disposed electronic members may be formed. As the conductive circuits, circuits obtained by printing a conductive paste on the substrate sheet and circuits obtained by etching laminates of the substrate sheet and a metal foil such as a copper foil into the form of the circuits are used. The antenna may be formed with the above conductive circuit. The electronic members and the electronic circuits can be connect to each other via solder or an isotropic conductive material.

In the process of the present invention, the surface of the substrate sheet on which an electronic chip and members related to the chip are disposed is coated with the composition for sealing the card of the present invention using a conventional apparatus for coating such as a knife coater, a roll knife coater, a die coater, a kiss roll coater or a reverse roll coater. After the coating layer is formed, a cover sheet is tightly placed on the coating layer.

As the cover sheet, the sheets having the electric insulating property shown above as the examples of the substrate sheet can be used. Among these sheets, flexible sheets made of polyesters are preferable and flexible sheets made of polyethylene terephthalate are more preferable.

The sealing composition is cured by irradiation of an ionizing radiation and preferably ultraviolet light to the laminate having the coating layer generally at the room temperature and the substrate sheet and the cover sheet are tightly attached to each other by adhesion. When ultraviolet light is used as the ionizing radiation, a material transmitting light (ultraviolet light) is used for the cover sheet and the sealing composition can be cured by irradiation of ultraviolet light at the side of the cover sheet. When electron beams are used as the ionizing radiation, the electron beam can be applied either at the side of the cover sheet or at the side of the substrate sheet and the cover sheet may be made of a colored material.

Figure 2:
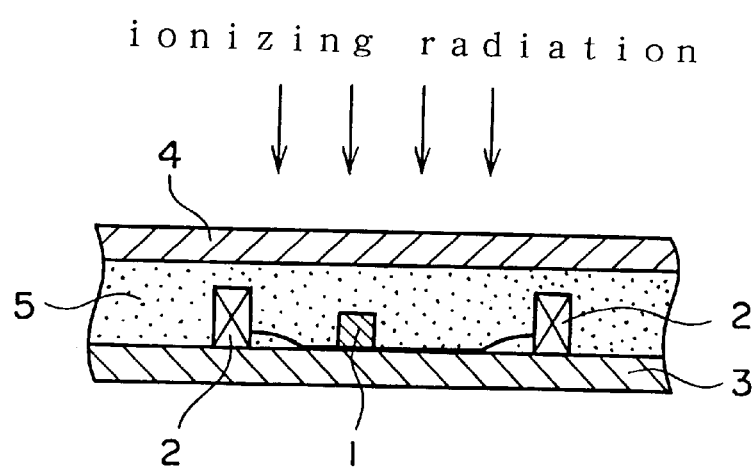
FIG. 2 shows a schematic partial sectional view of an example of a card for describing the process for producing cards of the present invention.

FIG. 2 shows a schematic partial sectional view of an example of a card for describing the process for producing cards of the present invention. An IC chip 1 and an antenna 2 are fixed by adhesion on one face of a substrate sheet 3 and a circuit having a prescribed structure is formed. On the face of the substrate sheet 3 on which the IC chip 1 and others are disposed, a coating layer 5 made of the sealing composition is disposed. A cover sheet 4 is disposed on the coating layer 5. By irradiation of an ionizing radiation to the coating layer 5 made of the sealing composition through the cover sheet 4, the coating layer 5 is cured and an IC card having the cover sheet on one face of the substrate sheet is prepared.

In accordance with the process for producing a card of the present invention, not only a card having electronic members on one face of a substrate alone but also a card having electronic members on both faces of a substrate can be produced.

Specifically, a coating layer comprising the sealing composition is disposed in accordance with the above procedure on one face of a substrate sheet having electronic members disposed on both faces. A cover sheet is placed tightly on the coating layer and the sealing composition is cured by application of an ionizing radiation. Subsequently, the other face of the substrate sheet is treated in accordance with the same procedures and a card having electronic members on both faces of the substrate can be prepared.

Figure 3:
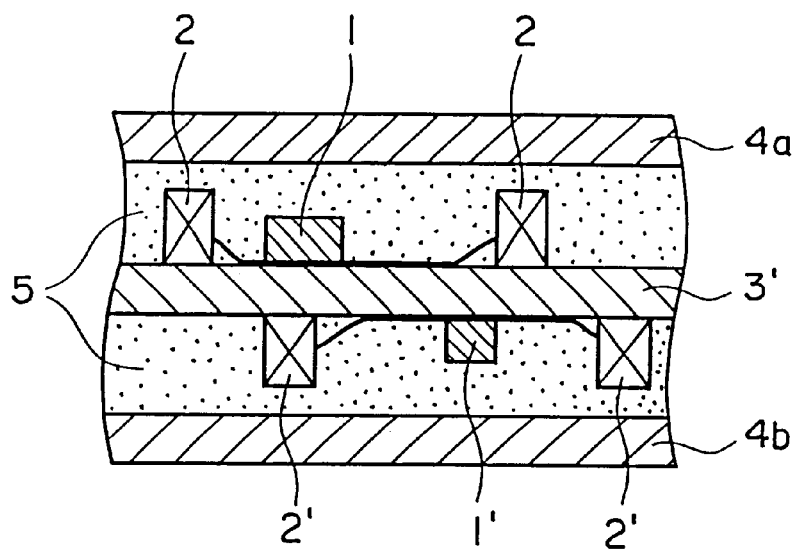
FIG. 3 shows a schematic partial sectional view of an example of a card in which a substrate sheet has electronic members on both faces.

FIG. 3 shows a schematic partial sectional view of an example of a card in which a substrate sheet has electronic members disposed on both faces. On both faces of a substrate sheet 3', IC chips 1 and 1' and antennas 2 and 2' are fixed by adhesion. Also on both faces of the substrate sheet 3', coating layers 5 made of the sealing composition are disposed. On the surface of each coating layer 5, a cover sheet 4a or 4b is tightly placed.

When a sheet of a synthetic resin is used for the substrate sheet and the cover sheet, a surface treatment such as an oxidizing treatment and a roughening treatment may be applied to one or both faces of the sheets, where desired. Examples of the oxidizing treatment include the treatment by corona discharge, the treatment with chromic acid (a wet process), the treatment by flame, the treatment with heated air and the treatment using ozone and ultraviolet light. Examples of the roughening treatment include the sand blast treatment and the treatment with a solvent. The surface treatment can be suitably selected in accordance with the type of the sheet of the synthetic resin. In general, the treatment by corona discharge is preferably used from the standpoint of the effect and operability.

In accordance with the process of the present invention, the card exhibiting excellent adhesion between the substrate sheet and the cover sheet and having faces with little unevenness, suitable flexibility and excellent reliability can be produced rapidly in great amounts.

The card produced as described above may have dimensions such as a thickness of 0.76 mm, a width of 54 mm and a length of 85 mm in accordance with the standard. In this case, the thickness of the substrate sheet, the cover sheet and the cured coating layer of the sealing composition in the process of the present invention may be selected in a manner such that the entire thickness of the produced card is, for example, 0.76 mm.

The surface of the cover sheet of the obtained card may be treated by embossing to exhibit various informations, may have printed characters and patterns or may have a stripe of a magnetic layer, where desired.

To summarize the advantages obtained by the invention, the composition for sealing the card of the present invention can be cured by application of an ionizing radiation, gives excellent adhesion between a substrate sheet on which an electronic chip and members related the electronic chip are disposed and a cover sheet and the card having faces with little unevenness, suitable flexibility and excellent reliability can be obtained.

By using the sealing composition, the card having the above advantageous properties can be produced rapidly in great amounts.

EXAMPLES

The present invention will be described more specifically in the following with reference to examples. However, the present invention is not limited to the examples.

The physical properties of sealing compositions before and after being cured and laminated sheets in the examples were evaluated in accordance with the following methods.

(1) Viscosity of a Sealing Composition Before Being Cured

The viscosity was measured at 23° C. using a B-type viscometer.

(2) Surface Tension of a Sealing Composition Before Being Cured

The surface tension was measured at 23° C. in accordance with the pendant drop method using a glass tube having an outer diameter of 2 mm and an inner diameter of 1 mm.

(3) Tensile Modulus of a Cured Product

The tensile modulus was measured in accordance with the method of Japanese Industrial Standard K7113, Tensile Test of Plastics, using test piece No. 2 described in the standard.

The thickness of the test piece was 1 mm and the speed of elongation was 1 mm/minute.

(4) Adhesive Strength Between Layers of a Laminate

A sample cut to a width of 25 mm and a length of 270 mm was prepared and the adhesive strength between layers was measured in accordance with the peeling method at 180° at a speed of elongation of 30 mm/minute using the prepared sample.

(5) Separation Between Layers in a Laminate by a Dynamic Bending Test

The bending test was conducted in accordance with the method of the bending test described in Japanese Industrial Standard X6305, Test Method of a Discrimination Card, 6.1 Dynamic Bending Strength. A sample cut to a width of 53.98 mm and a length of 85.60 mm was prepared. One end of the sample was fixed to the testing apparatus and the sample was bent 250 times around the A axis.

After the test, the sample was visually observed and examined with respect to the separation between layers.

(6) Separation Between Layers in a Laminate by a Dynamic Twisting Test

The twisting test was conducted in accordance with the method of the twisting test described in Japanese Industrial Standard X6305, Test Method of a Discrimination Card, 6.2 Dynamic Twisting Strength. A sample cut to a width of 53.98 mm and a length of 85.60 mm was prepared. One end of the sample was fixed to the testing apparatus and the sample was twisted 250 times at a twist angle of 30°.

After the test, the sample was visually observed and examined with respect to the separation between layers.

Example 1

To 50 g of a urethane acrylate prepolymer (a polymerizable prepolymer of an acrylate) having a weight-average molecular weight of 10,000 as the acrylate compound polymerizable by ionizing radiation, 10 g of isobornyl acrylate as the monomer to decrease the surface tension, 5 g of 2-ethylhexyl acrylate as the reactive diluent, 0.1 g of trimethylolpropane triacrylate, 5 g of an adduct of trimethylolproane with tolylene diisocyanate as the polyfunctional isocyanate compound and 3 g of benzophenone were added. The components were mixed together by stirring and a sealing composition was prepared. The sealing composition had a viscosity of 2,600 cps and a surface tension of 36 dyne/cm at 25° C.

A sheet of polyethylene terephthalate (PET) having a width of 210 mm, a length of 270 mm and a thickness of 125

μm was coated with the above sealing composition in an amount such that the thickness was 70 μm. On the formed coating layer, a transparent sheet of PET having a width of 210 mm, a length of 270 mm and a thickness of 125 μm was placed. Light was applied to the prepared laminate from a mercury lamp in the condition of an intensity of irradiation of 120 W/cm, a distance between the laminate and the lamp of 10 cm and a time of irradiation of 5 seconds. Thus, the sealing composition was cured and a laminate sheet was prepared.

The properties of the laminate sheet are shown in Table 1. The cured laminate sheet had a tensile modulus of 0.67 kg/mm².

Example 2

A laminate sheet was prepared in accordance with the same procedures as those conducted in Example 1 except that an adduct of trimethylolpropane with isophorone diisocyanate was used in place of the adduct of trimethylolpropane with tolylene diisocyanate.

The physical properties of the laminate sheet are shown in Table 1. The sealing composition had a viscosity of 2,500 cps and a surface tension of 36 dyne/cm at 25° C. The cured laminate sheet had a tensile modulus of 0.69 kg/mm².

Example 3

A laminate sheet was prepared in accordance with the same procedures as those conducted in Example 1 except that a trimer of hexamethylene diisocyanate (an isocyanurate) was used in place of the adduct of trimethylolpropane with tolylene diisocyanate.

The physical properties of the laminate sheet are shown in Table 1. The sealing composition had a viscosity of 2,500 cps and a surface tension of 36 dyne/cm at 25° C. The cured laminate sheet had a tensile modulus of 0.62 kg/mm².

Example 4

A sealing composition was prepared in accordance with the same procedures as those conducted in Example 1 except that a trimer of hexamethylene diisocyanate (an isocyanurate) was used in place of the adduct of trimethylolpropane with tolylene diisocyanate.

A copper foil having a width of 210 mm, a length of 270 mm and a thickness of 35 μm was coated with the above sealing composition in an amount such that the thickness was 70 μm. On the formed coating layer, a transparent sheet of PET having a width of 210 mm, a length of 270 mm and a thickness of 125 μm was placed. Light was irradiated to the prepared laminate at the side of the sheet of PET from a mercury lamp in the condition of an intensity of irradiation of 120 W/cm, a distance between the laminate and the lamp of 10 cm and a time of irradiation of 5 seconds. Thus, the sealing composition was cured and a laminate sheet was prepared.

The physical properties of the laminate sheet are shown in Table 1. The sealing composition had a viscosity of 2,500 cps and a surface tension of 35 dyne/cm at 25° C. The cured laminate sheet had a tensile modulus of 0.63 kg/mm².

Comparative Example 1

A laminate sheet was prepared in accordance with the same procedures as those conducted in Example 1 except that the adduct of trimethylolpropane with tolylene diisocyanate was not used.

The physical properties of the laminate sheet are shown in Table 1. The sealing composition had a viscosity of 2,700 cps and a surface tension of 36 dyne/cm at 25° C. The cured laminate sheet had a tensile modulus of 0.53 kg/mm².

TABLE 1

|  | Adhesive strength between layers (g/25 mm) | Separation between layers after bending test | Separation between layers after twisting test |
| --- | --- | --- | --- |
| Example 1 | 2,500 | none | none |
| Example 2 | 2,200 | none | none |
| Example 3 | 2,800 | none | none |
| Example 4 | 3,500 | none | none |
| Comparative Example 1 | 800 | found | found |

Example 5

A film of PET having a thickness of 125 μm which had an IC chip having the maximum height of 240 μm and an antenna coil disposed on one face of the film was used as the substrate sheet. As shown in FIG. 2, on the face of the substrate sheet on which the IC chip and the antenna were disposed, a coating layer of the sealing composition obtained in Example 1 was formed in a manner such that the thickness was 510 μm after being cured. On the formed coating layer, a transparent film of PET having a thickness of 125 μm was tightly placed as the cover sheet.

Then, light was applied at the side of the cover sheet of the film of PET in the same manner as that in Example 1. Thus, the sealing composition was cured and a laminate sheet having the cover sheet was prepared. The obtained laminate sheet was cut to a prescribed shape and an IC card of the non-contact type having a size of 85×54×0.76 mm was prepared.

The dynamic bending test and the dynamic twisting test were conducted using the prepared IC card in accordance with the same procedures as those conducted in Examples 1 to 4 and Comparative Example 1. No separations between layers were found in any test. Unevenness caused by the disposed electronic members was not found on the surface of the IC card.

Example 6

A film of PET having a thickness of 80 μm which had IC chips having the maximum height of 240 μm and antenna coils disposed on both faces of the film was used as the substrate sheet. On one of the faces of the substrate sheet, a coating layer of the sealing composition obtained in Example 1 was formed in a manner such that the thickness was 260 μm after being cured. On the formed coating layer, a transparent film of PET having a thickness of 80 μm was tightly placed as the cover sheet. Then, light was applied at the side of the cover sheet of the film of PET. Thus, the sealing composition was cured and a laminate sheet having the cover sheet on one face was prepared.

On the other face of the laminate, a cover sheet of a transparent film of PET having a thickness of 80 μm was laminated in the same manner as that described above. The obtained laminate sheet was cut to a prescribed shape and an IC card of the non-contact type having a size of 85×54×0.76 mm shown in FIG. 3 was prepared.

The dynamic bending test and the dynamic twisting test were conducted using the prepared IC card in accordance with the same procedures as those conducted in Examples 1 to 4 and Comparative Example 1. No separations between layers were found in any test. Unevenness caused by the disposed electronic members was not found on the surface of the IC card.

What is claimed is:

1. A card sealed by a composition which consists essentially of:
   (A) an acrylate compound polymerizable by an ionizing radiation, the acrylate compound consists essentially of at least one of acrylate prepolymers having a weight-average molecular weight in the range of 500 to 100,000 selected from the group consisting of (a) prepolymers of polyester acrylates, (b) prepolymers of epoxyacrylates, (c) urethane acrylates, and (d) polyol acrylates;
   (B) 1 to 40 parts by weight of a polyfunctional isocyanate compound per 100 parts by weight of said acrylate compound; and
   (C) a photopolymerization initiator,
   the composition being cured by irradiation of the ionizing radiation after sealing.

2. The card according to claim 1 wherein the viscosity at 25° C. of the composition before curing is from 100 to 5,000 cps.

3. The card according to claim 1 wherein the composition comprises as component (A) an acrylate prepolymer having the weight-average molecular weight in the range of 3,000 to 100,000 and a polymerizable monomer.

4. The card according to claim 3 wherein the polymerizable monomer comprises at least one monomer having a surface tension of no more than 40 dyne/cm.

5. The card according to claim 4 wherein the surface tension of the composition before curing is in the range of 30 to 40 dyne/cm.

* * * * *